United States Patent [19]

Geipel, Jr. et al.

[11] 4,398,341

[45] Aug. 16, 1983

[54] METHOD OF FABRICATING A HIGHLY CONDUCTIVE STRUCTURE

[75] Inventors: Henry J. Geipel, Jr., Essex Junction; Larry A. Nesbit, Williston, both of Vt.

[73] Assignee: International Business Machines Corp., Armonk, N.Y.

[21] Appl. No.: 304,436

[22] Filed: Sep. 21, 1981

[51] Int. Cl.$^3$ .......................................... H01L 21/285
[52] U.S. Cl. ...................................... 29/578; 29/591; 357/67; 427/88
[58] Field of Search .................... 29/578, 591; 427/88; 357/67

[56] References Cited

U.S. PATENT DOCUMENTS

| | | | |
|---|---|---|---|
| 3,617,824 | 11/1971 | Shinoda et al. | 357/41 X |
| 4,128,670 | 12/1978 | Gaensslen | 427/86 |
| 4,180,596 | 12/1979 | Crowder et al. | 427/42 |
| 4,263,058 | 4/1981 | Brown et al. | 427/88 X |
| 4,285,761 | 8/1981 | Fatula et al. | 29/571 X |
| 4,329,706 | 5/1982 | Crowder et al. | 29/571 X |

OTHER PUBLICATIONS

P. Ho et al., IBM Technical Disclosure Bulletin, vol. 21, No. 12, May 1979, pp. 5039–5040, "Method for Obtaining Large Grain Silicon Films on Amorphous Substrate".

T. Mochizuki et al., Japanese Journal of Applied Physics, vol. 17, 1978 Supplement 17-1, pp. 37–42, "A New MOS Process Using MoSi$_2$ as a Gate Material".

Laibowitz et al., IBM Technical Disclosure Bulletin, vol. 21, No. 2, May 1979, pp. 5051 and 5052.

*Primary Examiner*—G. Ozaki
*Attorney, Agent, or Firm*—Stephen J. Limanek

[57] ABSTRACT

An improved method of fabricating a silicide structure includes depositing a metal, e.g., molybdenum or tungsten, directly onto a thin insulating layer of silicon dioxide and/or silicon nitride formed on a semiconductor substrate, co-depositing the metal and silicon onto the metal layer and then depositing silicon onto the co-deposited metal-silicon layer. This structure is annealed at a temperature sufficient to form a metal silicide between the thin insulating layer and the layer of silicon. The silicon layer serves as a source of silicon for the metal layer which is consumed during the annealing step to form, along with the co-deposited metal-silicon layer, a relatively thick metal silicide layer directly on the thin silicon dioxide layer. A sufficiently thick silicon layer is initially provided on the co-deposited metal-silicon layer so that a portion of the initial silicon layer remains after the annealing step has been completed. This excess silicon may be oxidized to form a passivating layer on top of the thick metal silicide layer. If all or a part of the silicon in the remaining silicon layer after annealing is removed, the thick metal silicide layer may be exposed to an oxidizing ambient for self-passivation. In this latter instance, the pure metal precipitates in the silicide resulting in a line with even greater conductivity than a pure silicide line, which is very desirable for interconnections.

18 Claims, 2 Drawing Figures

METHOD OF FABRICATING A HIGHLY CONDUCTIVE STRUCTURE

DESCRIPTION

1. Technical Field

This invention relates to a method of fabricating high conductivity silicide electrodes, particularly for field effect transistors, and interconnections in the integrated semiconductor circuit technology.

2. Background Art

In the development of integrated circuit technology, there has been a tremendous increase in recent years in the density of circuits formed on the surface of a small semiconductor chip. This increase in circuit density has produced a need for electrodes and interconnecting lines with very small dimensions, on the order of a micron or submicron. However, electrodes and interconnections having such small dimensions cause propagation delays due to their increased resistivity. Furthermore, when working with electrodes and interconnections having such small dimensions, it is desirable to use conductive materials that are self-passivating.

Doped polycrystalline silicon, or polysilicon, has been used extensively in the development of integrated circuits because of its high temperature stability and its ability to provide a stable insulating layer by self-passivation. Unfortunately, however, as dimensions decrease, the relatively high resistivity of polysilicon causes undesirable propagation delays.

In order to fabricate very high density integrated circuits with electrodes and interconnections of decreasing dimensions while retaining low sheet resistivity, the use of metal silicides has been proposed. In addition to their lower sheet resistivity, silicides may also be self-passivating, as a layer of silicon dioxide forms on the free or open surfaces of the silicide when exposed to an oxidizing ambient. A method for making silicides is taught in IBM Technical Disclosure Bulletin, Vol. 21, No. 12, May 1979, pp. 5039–5040, which suggests evaporating a metal compound on an insulating substrate, providing silicon on the metal compound and then annealing the structure. Commonly assigned U.S. Pat. No. 4,128,670, filed Nov. 11, 1977, by F. H. Gaensslen, describes a method of fabricating a silicide which includes depositing silicon on a substrate, and then a silicide-forming metal and silicon, without breaking vacuum, and annealing, with the metal reacting at two surfaces with the silicon, more specifically, polysilicon, to provide the silicide. This silicide structure generally works very satisfactorily except that the work function of this structure is that of silicon which is often undesirable and it cannot be used in a fine line producing liftoff process. Commonly assigned U.S. Pat. No. 4,180,596, filed June 30, 1977, by B. L. Crowder and S. Zirinsky, teaches co-evaporation of silicon and a silicide-forming metal, such as molybdenum, tantulam, tungsten, rhodium and mixtures thereof, to produce a silicide layer. This latter patent also teaches the removal of the silicide from predetermined portions of the substrate supporting the silicide by lift-off methods. An article entitled "A New MOS Process Using $MoSi_2$ as a Gate Material", by T. Mochizuki, et al in *Japanese Journal of Applied Physics,* Vol. 17 (1978) Supplement 17-1, pp. 37–42, discloses molybdenum silicide deposited on an oxidized silicon wafer.

Co-evaporating silicon and a metal, such as molybdenum or tungsten, directly onto a thin layer of silicon dioxide, such as on a thin field effect transistor oxide, has often resulted in shorts and/or unacceptably low breakdown voltages across the thin silicon dioxide layer, e.g., less than 3 to 4 megavolts per centimeter.

When a pure metal, e.g., molybdenum, is evaporated directly onto a thin layer of silicon dioxide and annealed, acceptable high-voltage breakdown values, 8 megavolts per centimeter or higher, are obtained. Unfortunately, pure molybdenum is not self-passivating and, therefore, it is generally not suitable for use as a line or electrode in dense highly integrated semiconductor circuits.

DISCLOSURE OF THE INVENTION

It is an object of this invention to provide an improved method of fabricating a highly conductive silicide structure which has a high breakdown voltage and an adjustable work function.

It is another object of this invention to provide an improved method of fabricating a silicide structure which has high yield and high performance and is compatible with liftoff techniques.

In accordance with the teachings of this invention, an improved method of fabricating a silicide structure includes depositing a metal, e.g., molybdenum or tungsten, directly onto a thin insulating layer of silicon dioxide formed on a semiconductor substrate, co-depositing the metal and silicon onto the metal layer and then depositing silicon onto the co-deposited metal-silicon layer. Upon annealing this structure, a metal silicide forms down to the thin silicon dioxide layer. The silicon layer serves as a source of silicon for the metal layer which is consumed during the annealing step to form, along with the co-deposited metal-silicon layer, a relatively thick metal silicide layer directly on the thin silicon dioxide layer. A sufficiently thick silicon layer is initially provided on the co-deposited metal-silicon layer so that a portion of the initial silicon layer remains after the annealing step has been completed. This excess silicon may then be oxidized to form a passivating layer on top of the thick metal silicide layer. If all of the silicon in the silicon layer has been consumed during the annealing step, the thick metal silicide layer may be exposed to an oxidizing ambient for self-passivation. In this latter instance, the pure metal precipitates in the silicide resulting in a line with even greater conductivity than a pure silicide line, which is very desirable for interconnections.

The foregoing and other objects, features, and advantages of the invention will be apparent from the following and more particular description of the preferred embodiments of the invention, as illustrated in the accompanying drawing.

BEST MODE FOR CARRYING OUT THE INVENTION

Figure 1:
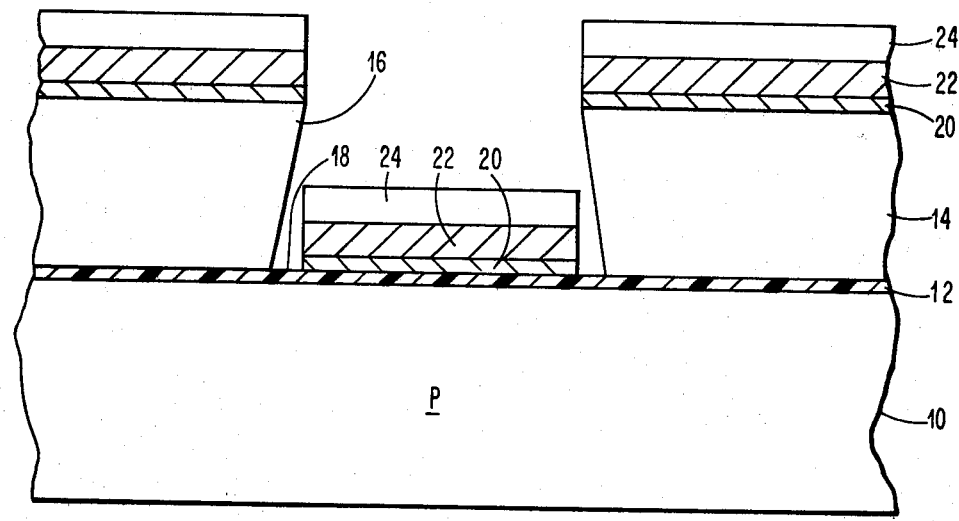
FIG. 1 illustrates a sectional view of the structure formed by the method of the present invention during an early phase of the method.

Referring to FIG. 1 of the drawing in more detail, there is illustrated in sectional view the structure formed by the method of the present invention prior to an annealing step. The structure includes a semiconductor substrate 10, preferably made of silicon, on which is grown, at, e.g., 800°-1000° C., a thin layer of inert silicon dioxide 12 having a thickness of, e.g., between 20 to 50 nanometers, suitable for use as a gate oxide for a field effect transistor. If desired, layer 12 may be made of silicon nitride, or a combination of silicon dioxide and silicon nitride. To produce a high conductivity silicide interconnection line or electrode on the silicon dioxide layer 12, a layer of photoresist 14 is deposited on the silicon dioxide layer 12 and an opening 16 is formed therein, by known techniques, to expose a portion of the surface 18 of the silicon dioxide 12. Through the opening 16 a metal is deposited directly on the surface 18 of the silicon dioxide layer 12 to form a layer 20 having a thickness of between 30 and 60 nanometers. The metal and silicon are then co-deposited by any conventional means onto the metal layer 20 to form a layer 22 having a thickness between 125 and 225 nanometers. Silicon is next deposited onto the co-deposited metal-silicon layer 22 to form a top intrinsic silicon layer 24 having a thickness of between 100 and 300 nanometers. If desired, metal layer 20, metal-silicon layer 22 and silicon layer 24 may be deposited by using known dual electron beam evaporation techniques at a temperature, e.g., between 100° and 250° C. By using these techniques, layers 20, 22 and 24 may be deposited sequentially in one evaporation system without breaking the vacuum of the evaporator. The metal layer 20 may include a metal such as molybdenum, tungsten, tantalum, cobalt, titanium or rhodium, or other refractory metals.

Figure 2:
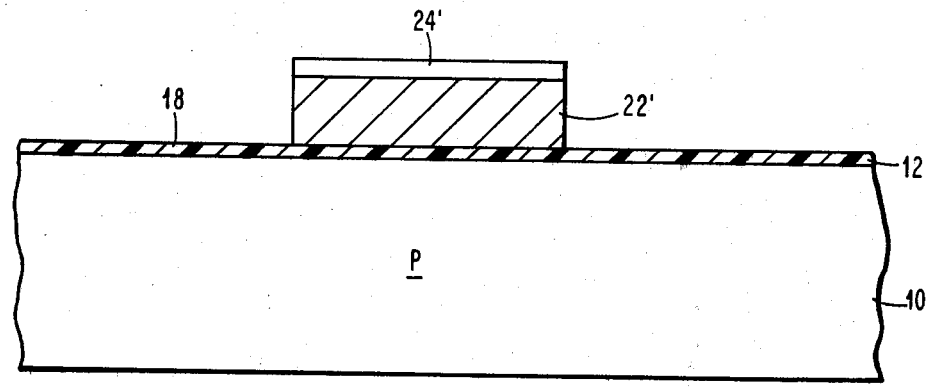
FIG. 2 illustrates a sectional view of the structure formed by the method of the present invention during a later phase of the method.

After completing the fabrication of the structure of FIG. 1 of the drawings, the remaining portion of the photoresist layer 14 is removed by known techniques along with the portions of the metal, metal-silicon and silicon layers 20, 22 and 24 formed on the photoresist layer 14. The remaining portion of the structure of FIG. 1 is then annealed, e.g., in vacuum, argon, or nitrogen at a temperature between 750° to 1200° C. for 30 to 60 minutes, so as to consume all of the metal of layer 20 and at least a portion of the silicon in layer 24 to form a relatively thick metal silicide layer 22', as indicated in FIG. 2 of the drawings, with the silicon layer 24 acting as a silicon source for the metal layer 20 of FIG. 1. It can be seen that this silicide layer 22' is formed directly on the surface 18 of the silicon dioxide layer 12 with a thinner layer of silicon 24' remaining as the top layer of the resulting structure. By known techniques, the silicon layer 24' may be oxidized to form a passivation layer of silicon dioxide. In those regions of the surface 18 of the silicon dioxide layer 12 where the silicide is to be used as an interconnecting line, it is desirable to etch off part or all of the silicon layer 24' prior to oxidation in order to provide an interconnection line with increased conductivity since the pure metal in the silicide will precipitate to form a highly conductive line. In this manner, the silicide structure is provided with a dual conductivity. By varying the amount of metal produced in the silicide, the work function of the silicide layer 22' can be varied to produce electrodes which may be advantageously used in a wide spectrum of integrated semiconductor circuits. The mean breakdown voltage of the insulating layers under the silicides produced by the method of this invention was found to be nearly 7 megavolts per centimeter.

When molybdenum was used as the metal for the metal layer 20 and in the metal-silicon layer 22, analysis of the structure disclosed that after the structure was annealed, no elemental molybdenum was detected near the silicon dioxide layer 12 but two silicide phases tetragonal $MoSi_2$ and $Mo_5Si_3$ were observed in the silicide layer 22'.

Although lines or electrodes have been indicated in FIG. 1 of the drawing as being formed by a liftoff technique, it should be understood that silicide patterns may be formed by any conventional mask and etching technique and that the line or electrode pattern may be formed either prior to or after the annealing step of the process of this invention.

It can be seen that by the practice of the method of this invention, a silicide structure has been prepared which may take advantage of liftoff techniques to form highly dense and very fine lines or electrodes that are highly conductive, readily passivated and have a high breakdown voltage and a small vertical dimension. Furthermore, interconnection lines are formed with a pure metal as well as a silicide under the passivating layer, with the pure layer providing a lower line resistivity than that produced by known doped polysilicon/silicide lines or pure silicide lines.

While the invention has been particularly shown and described with reference to preferred embodiments thereof, it will be understood by those skilled in the art that various changes in form and details may be made therein without departing from the spirit and scope of the invention.

What is claimed is:

1. A method of making a conductive structure comprising the steps of:
   depositing a layer of metal on an inert insulator,
   depositing a layer of atomic mixture of metal and silicon on said metal layer,
   depositing a layer of silicon on said layer of metal and silicon, and
   annealing said structure so as to convert said layer of atomic mixture of metal and silicon and substantially all of said metal layer and at least a portion of said silicon layer into metal silicide.

2. A method as set forth in claim 1 wherein only a portion of said silicon layer is converted into metal silicide and further including oxidizing the remaining portion of said silicon layer to form a passivating layer on said metal silicide layer.

3. A method as set forth in claim 2 wherein said oxidizing step forms a layer of silicon dioxide.

4. A method as set forth in claim 1 further including the step of etching at least some of the remaining portion of said silicon layer and oxidizing the remaining structure to form a passivating layer on said metal silicide layer.

5. A method as set forth in claim 4 wherein said oxidizing step forms a layer of silicon dioxide and said metal of said metal layer and said metal of said layer of metal and silicon are the same type of metal.

6. A method as set forth in claim 1 wherein said layer of atomic mixture of metal and silicon is deposited by co-evaporating said metal and silicon and said structure is annealed in an inert atmosphere.

7. A method as set forth in claim 6 wherein said layers are formed by using electron beam evaporation techniques.

8. A method as set forth in claim 6 wherein said layers are formed by first depositing the metal of said metal layer, then co-depositing the metal and silicon of said metal and silicon layer and finally depositing the silicon of said silicon layer.

9. A method as set forth in claim 8 wherein said layers are deposited at a temperature between 100° C. and 250° C.

10. A method as set forth in claim 9 wherein said layers are annealed at a temperature between 750° C. and 1200° C. for a period of time between 30 minutes and 60 minutes in an argon or nitrogen atmosphere.

11. A method as set forth in claim 10 wherein said inert insulator has a thickness between 30 and 50 nanometers, said metal layer has a thickness between 30 and 60 nanometers, said layer of atomic mixture of metal and silicon has a thickness between 125 and 225 nanometers and said silicon layer has a thickness between 100 and 300 nanometers.

12. A method as set forth in claim 1 wherein said metal is a refractory metal and said inert insulator includes a layer of silicon nitride deposited onto a semiconductor substrate.

13. A method of making a silicide structure comprising the steps of:
growing a layer of insulation on a silicon substrate,
depositing a metal selected from the group consisting of molybdenum, tungsten, tantalum, titanium, cobalt and rhodium directly onto the surface of said insulation layer to form a metal layer,
co-depositing said metal and silicon onto the surface of said metal layer to form a composite metal-silicon layer,
depositing silicon onto said composite metal-silicon layer to form an intrinsic silicon layer, and
annealing said layers in an inert atmosphere at a temperature sufficient to convert said composite metal-silicon layer, said metal layer and at least a portion of said silicon layer into a silicide layer forming a first interface with said insulation layer and a second interface with the remaining portion of said silicon layer.

14. A method as set forth in claim 13 wherein only a portion of said silicon layer is converted into a silicide layer and further including the step of oxidizing the remaining portion of said silicon layer to form a layer of silicon dioxide in contact with said silicide layer.

15. A method as set forth in claim 13 further including the step of etching at least some of the remaining portion of said silicon layer and oxidizing the remaining structure to form a layer of silicon dioxide in contact with said silicide layer.

16. A method of making a conductive structure comprising the steps of:
growing a layer of insulation on the surface of a semiconductor substrate,
depositing a layer of photoresist onto said insulation layer,
forming an opening in said photoresist layer to expose the surface of said insulation layer,
depositing a metal from the group consisting of molybdenum, tungsten, tantalum, cobalt, titanium and rhodium through said opening to form a metal layer directly in contact with said insulation layer,
co-depositing said metal and silicon through said opening to form a composite metal-silicon layer directly in contact with said metal layer,
depositing silicon through said opening to form a silicon layer in contact with said composite metal-silicon layer,
removing the remaining portion of said photoresist layer from the surface of said insulation layer, and
annealing said metal, composite metal-silicon and silicon layers at a temperature sufficient to convert said metal and composite metal-silicon layers and a portion of said silicon layer into a silicide layer forming a first interface with said insulation layer and a second interface with the remaining portion of said silicon layer.

17. A method as set forth in claim 16 further including the step of oxidizing the remaining portion of said silicon layer to form a layer of silicon dioxide.

18. A method as set forth in claim 16 further including the steps of etching at least some of the remaining portion of said silicon layer and oxidizing the remaining structure to form a layer of silicon dioxide.

* * * * *